(12) United States Patent
Jang

(10) Patent No.: US 12,143,006 B2
(45) Date of Patent: Nov. 12, 2024

(54) MULTI-PIPE CONVERTER

(71) Applicant: LG INNOTEK CO., LTD., Seoul (KR)

(72) Inventor: Shin Young Jang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 103 days.

(21) Appl. No.: 17/777,755

(22) PCT Filed: Nov. 17, 2020

(86) PCT No.: PCT/KR2020/016207
§ 371 (c)(1),
(2) Date: May 18, 2022

(87) PCT Pub. No.: WO2021/107481
PCT Pub. Date: Jun. 3, 2021

(65) Prior Publication Data
US 2022/0407413 A1    Dec. 22, 2022

(30) Foreign Application Priority Data
Nov. 25, 2019    (KR) ........................ 10-2019-0152155

(51) Int. Cl.
*H05K 5/02* (2006.01)
*H02M 3/00* (2006.01)
*H05K 7/20* (2006.01)

(52) U.S. Cl.
CPC .......... *H02M 3/003* (2021.05); *H05K 5/0217* (2013.01); *H05K 7/209* (2013.01)

(58) Field of Classification Search
CPC ........ H02M 3/003; H02M 1/327; H02M 3/00; H05K 5/0217; H05K 7/209; H05K 7/20254; H05K 7/20272; H05K 7/20927; H05K 7/20936; H05K 7/20336
See application file for complete search history.

(56) References Cited

U.S. PATENT DOCUMENTS

| | | | |
|---|---|---|---|
| 10,925,181 B2 * | 2/2021 | Kim | H05K 7/20936 |
| 11,304,336 B2 * | 4/2022 | Kim | H05K 7/20327 |
| 11,477,922 B2 * | 10/2022 | Baik | H01L 23/427 |
| 2008/0198548 A1 | 8/2008 | Nakamura et al. | |

(Continued)

FOREIGN PATENT DOCUMENTS

| | | |
|---|---|---|
| CN | 101329147 A | 12/2008 |
| CN | 107816824 A | 3/2018 |

(Continued)

OTHER PUBLICATIONS

Extended European Search Report for European Application No. 20893412.5, dated Nov. 14, 2023.

*Primary Examiner* — Anthony Q Edwards
*Assistant Examiner* — Hung Q Dang
(74) *Attorney, Agent, or Firm* — Birch, Stewart, Kolasch & Birch, LLP

(57) ABSTRACT

A converter comprises: a housing including an inner space; electronic components disposed in the inner space; a first pipe disposed on the outer surface of the housing and comprising a first-first pipe and a first-second pipe arranged in parallel to and spaced apart from each other; and a second pipe coupled at both ends thereof to the first-first pipe and the first-second pipe, respectively.

17 Claims, 5 Drawing Sheets

(56) References Cited

U.S. PATENT DOCUMENTS

2014/0096938 A1* 4/2014 Kojima ................ H01L 23/473
                                                165/104.19
2020/0053912 A1* 2/2020 Kim ....................... H05K 7/209

FOREIGN PATENT DOCUMENTS

| CN | 110463369 A | 11/2019 | | |
|---|---|---|---|---|
| JP | 7-227634 A | 8/1995 | | |
| JP | 2004-356555 A | 12/2004 | | |
| JP | 2008-206243 A | 9/2008 | | |
| JP | 2010-114148 A | 5/2010 | | |
| JP | 2019-103316 A | 6/2019 | | |
| KR | 10-2019-0118440 A | 10/2019 | | |
| WO | WO2018174484 | * | 9/2018 | ............... H05K 7/20 |

* cited by examiner

MULTI-PIPE CONVERTER

CROSS REFERENCE TO RELATED APPLICATIONS

This application is the National Phase of PCT/KR2020/016207 filed on Nov. 17, 2020, which claims priority under 35 U.S.C. § 119 (a) to Patent Application No. 10-2019-0152155 filed in the Republic of Korea on Nov. 25, 2019, all of which are hereby expressly incorporated by reference into the present application.

TECHNICAL FIELD

The present invention relates to a converter.

BACKGROUND ART

The content described below provides background information on the present embodiment and does not describe the prior art.

As electric devices of automobiles, engine electric devices (starting device, ignition device, and charging device) and lighting device are common, but in recent years, as vehicles are more electronically controlled, most systems including chassis electric devices are becoming electric and electronic.

Various electric components such as lamps, audio, heaters, and air conditioners installed in automobiles receive power from the battery when the car is stopped and receive power from the generator when driving, and at this time, the power generation capacity of the 14V power system is used as a normal power supply voltage.

Recently, along with the development of the information technology industry, various new technologies (motorized power steering, Internet, and the like) for the purpose of increasing the convenience of automobiles are being adopted to vehicles, and in the future, it is expected that the development of new technologies that can utilize the current automobile system to the maximum will continue.

A hybrid electric vehicle (HEV), regardless of soft or hard type, is equipped with a DC-DC converter for supplying an electric load (12V). In addition, the DC-DC converter, which acts as a generator (alternator) of a general gasoline vehicle, supplies a voltage of 12V for the electric load by reducing the high voltage of the main battery (usually a high-voltage battery of 144V or more).

A DC-DC converter refers to an electronic circuit device that converts DC power of a certain voltage to DC power of another voltage, and is used in various fields such as television sets and automobile electronic products.

The outer appearance of a converter may be formed by the housing, and a plurality of electronic components for driving are disposed inside the housing. The plurality of electronic components generates heat by driving. For heat dissipation, a refrigerant pipe or a refrigerant passage for absorbing heat generated from the electronic component is disposed in the housing, but here is a problem in that heat dissipation within the housing is not sufficiently achieved with only the refrigerant pipe.

DETAILED DESCRIPTION OF THE INVENTION

Technical Subject

An object of the present embodiment is to provide a converter capable of enhancing the heat dissipation efficiency by improving the structure.

Technical Solution

A converter comprises: a housing including an inner space; electronic components disposed in the inner space; a first pipe disposed on the outer surface of the housing and comprising a first-first pipe and a first-second pipe disposed in parallel to and spaced apart from each other; and a second pipe coupled at both ends thereof to the first-first pipe and the first-second pipe, respectively.

The first pipe may be formed integrally with the housing.

A gap may be formed between an outer surface of the housing and the second pipe.

A heat dissipation plate being interposed between the outer surface of the housing and upper and lower surfaces thereof are being in contact with an outer surface of the housing and an outer surface of the second pipe, respectively, may be included.

The lengthwise direction of the first pipe may be formed in a first direction that is a straight line direction.

The second pipe may include a connection part formed in a second direction perpendicular to the first direction, and a first coupling part and a second coupling part respectively disposed at both ends of the connection part and formed in the first direction.

The first coupling part is disposed inside the first-first pipe, and the second coupling part may be disposed inside the first-second pipe.

An inlet port is coupled to one end of the first-first pipe, and an outlet port may be coupled to one end of the first-second pipe.

The cross-sectional area of the first pipe may be larger than the cross-sectional area of the second pipe.

In another embodiment, the converter comprises: a housing including an inner space; an electronic component disposed in the inner space; a first-first pipe disposed on an outer surface of the housing; a first-first pipe disposed on an outer surface of the housing and spaced apart from and parallel to the first-first pipe; a second pipe having both ends coupled to the first-first pipe and the first-second pipe; and a heat dissipation plate disposed between the housing and the second pipe.

Advantageous Effects

According to the present invention, since the refrigerant pipe is formed by combining the first pipe and the second pipe after the first pipe is manufactured as one body with the housing, there are advantages in that the manufacturing process becomes simplified and production efficiency becomes enhanced.

In addition, since a separate part such as a sealing member is not required inside the refrigerant pipe, the number of parts is reduced, and accordingly, there is an advantage in that the manufacturing cost is reduced.

BEST MODE

Hereinafter, preferred embodiments of the present invention will be described in detail with reference to the accompanying drawings.

However, the technical idea of the present invention is not limited to some embodiments to be described, but may be implemented in various forms, and within the scope of the technical idea of the present invention, one or more of the constituent elements may be selectively combined or substituted between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention.

In the present specification, the singular form may include the plural form unless specifically stated in the phrase, and when described as "at least one (or more than one) of A and B and C", it may include one or more of all combinations that can be combined with A, B, and C.

In addition, in describing the components of the embodiment of the present invention, terms such as first, second, A, B, (a), and (b) may be used. These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when described as being formed or arranged in "on (above)" or "below (under)" of each component, "on (above)" or "below (under)" means that it includes not only the case where the two components are directly in contact with, but also the case where one or more other components are formed or arranged between the two components. In addition, when expressed as "on (above)" or "below (under) ", the meaning of not only an upward direction but also a downward direction based on one component may be included.

Figure 1:
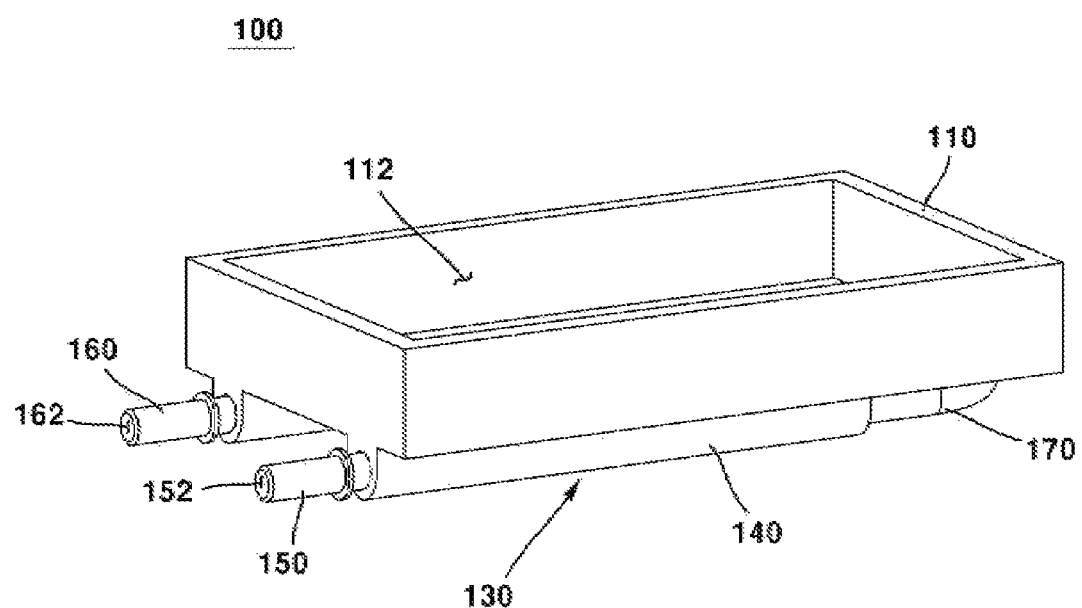
FIG. 1 is a perspective view of a converter according to an embodiment of the present invention.
Figure 2:
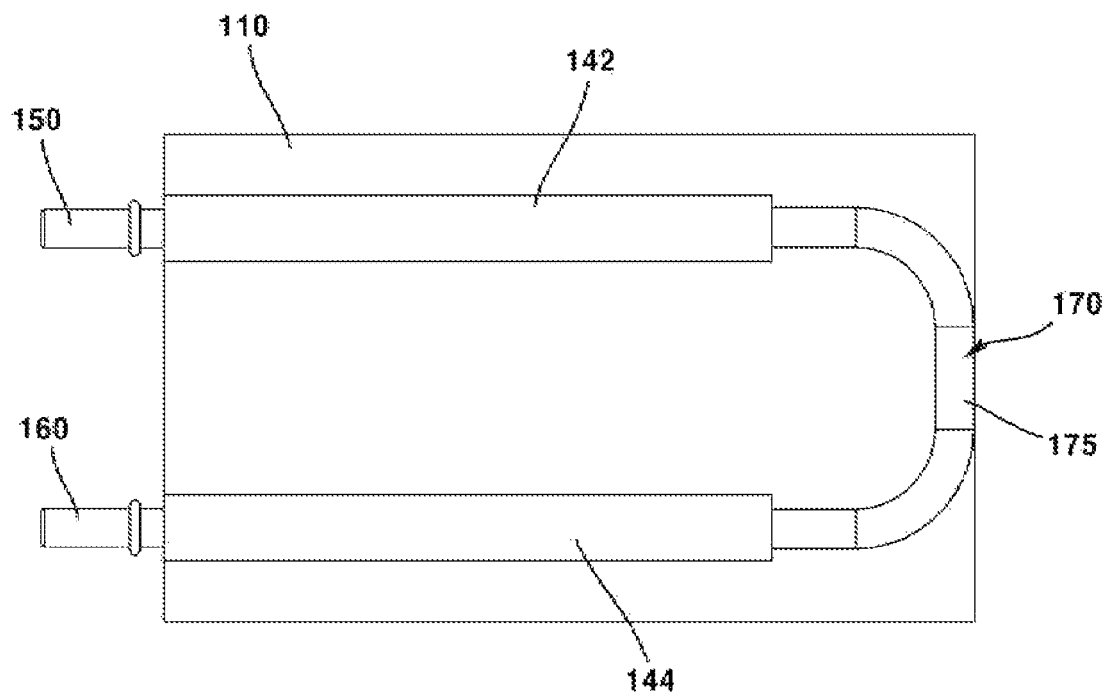
FIG. 2 is a plan view illustrating a lower surface of a converter according to an embodiment of the present invention.
Figure 3:
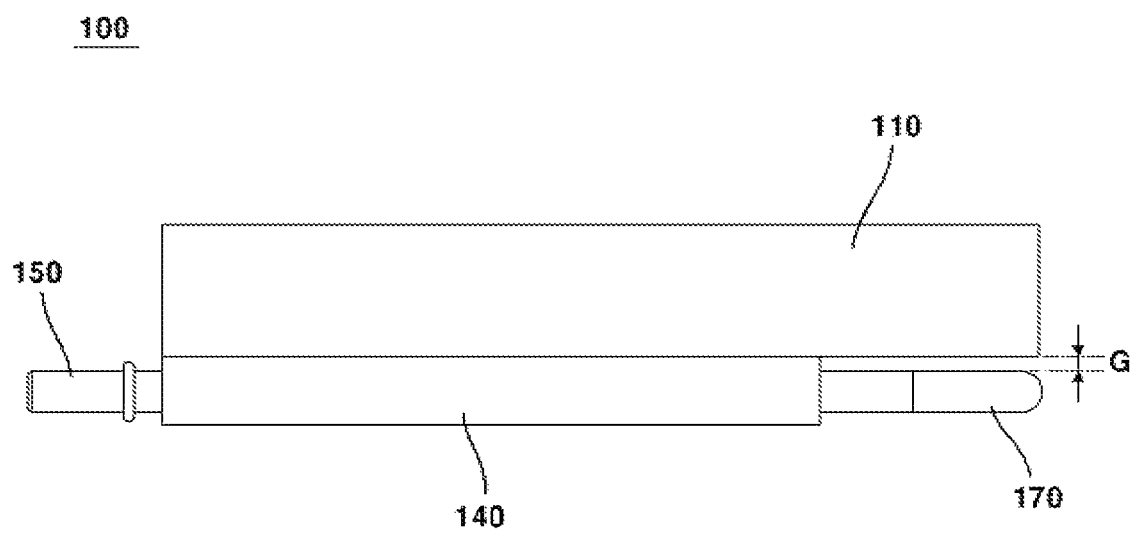
FIG. 3 is a plan view illustrating a side surface of a converter according to an embodiment of the present invention.
Figure 4:
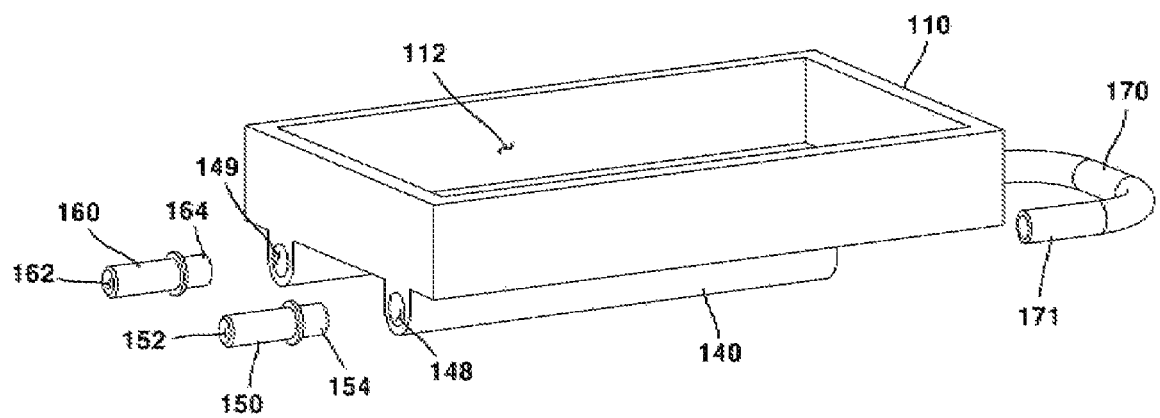
FIG. 4 is an exploded perspective view of a converter according to an embodiment of the present invention.
Figure 5:
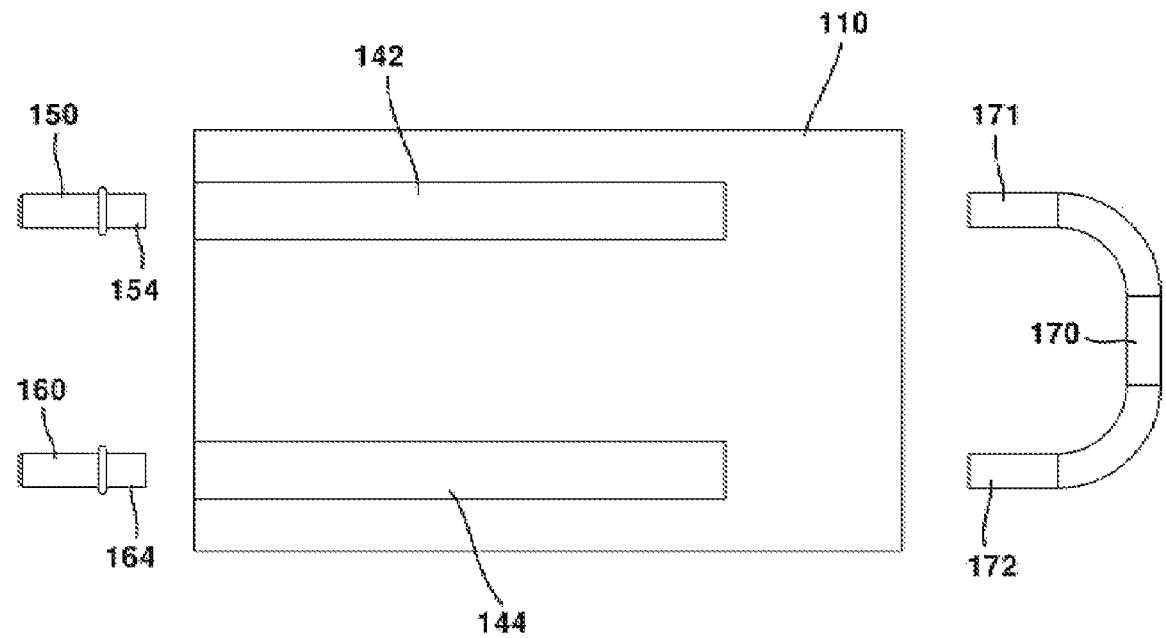
FIG. 5 is a plan view illustrating a lower surface of FIG. 4.
Figure 6:
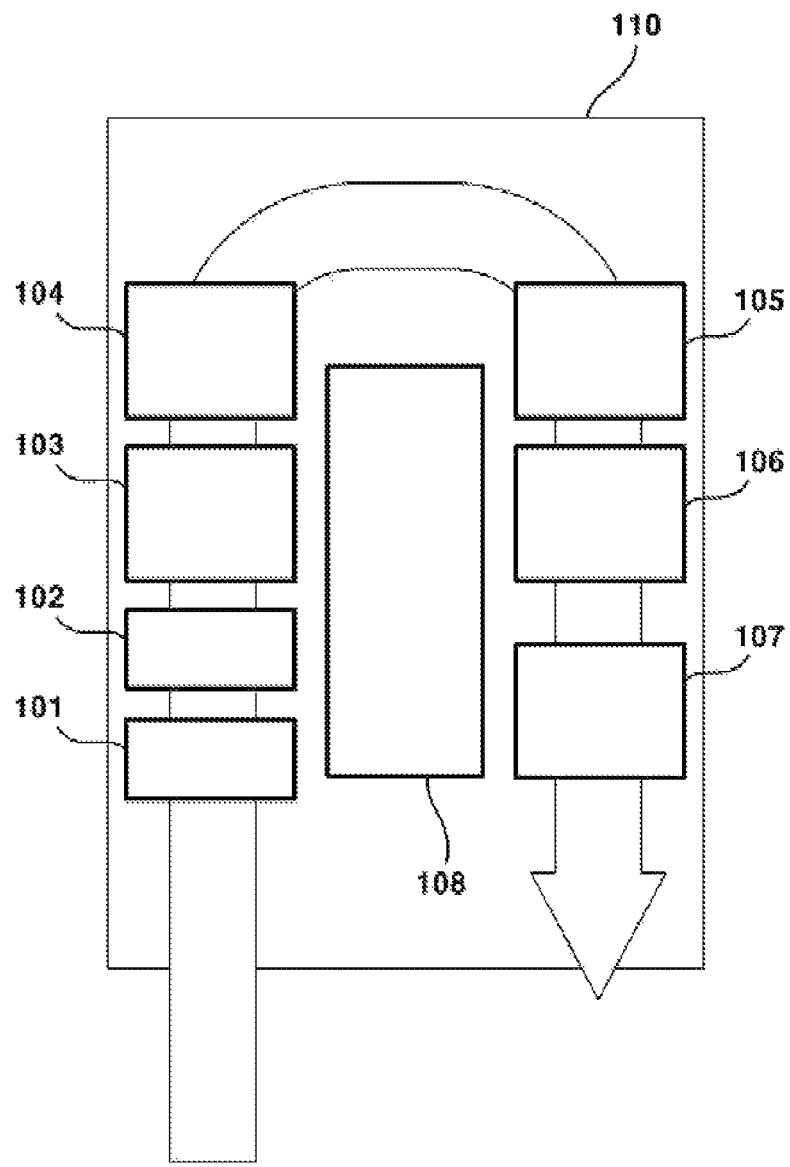
FIG. 6 is a conceptual diagram of a converter heat dissipation structure according to an embodiment of the present invention.

FIG. 1 is a perspective view of a converter according to an embodiment of the present invention; FIG. 2 is a plan view illustrating a lower surface of a converter according to an embodiment of the present invention; FIG. 3 is a plan view illustrating a side surface of a converter according to an embodiment of the present invention; FIG. 4 is an exploded perspective view of a converter according to an embodiment of the present invention; FIG. 5 is a plan view illustrating a lower surface of FIG. 4; and FIG. 6 is a conceptual diagram of a converter heat dissipation structure according to an embodiment of the present invention.

Referring to FIGS. 1 to 6, the outer appearance of the converter 100 according to the embodiment of the present invention may be formed by the housing 110. An internal space 112 for accommodating a plurality of electronic components may be formed inside the housing 110.

A cover (not shown) may be coupled to an upper surface of the housing 110. The cover may be coupled to the housing 110 to cover the upper surface of the inner space 112. That is, the surface on which the cover is disposed may be defined as an upper surface of the housing 110. Accordingly, when the cover is separated from the housing 110, the inner space 112 may be exposed upward.

The housing 110 may have a rectangular cross-section. The housing 110 may be formed in an approximately rectangular parallelepiped shape. The material of the housing 110 may include aluminum (Al).

One or more electronic components (not shown) for driving the converter 100 may be disposed in the inner space 112. As examples of the electronic components, a printed circuit board (not shown) on which one or more elements are mounted, a transformer for voltage regulation, and an inductor to get inductance may be included. The configurations of the above-described electronic components are exemplary, and the electronic components according to the present invention include entire configurations being disposed and operated inside the converter 100. The electronic components may generate heat by driving. Heat generated from the electronic components may be heat-exchanged with a refrigerant flowing through a refrigerant pipe, which will be described later, and radiated.

A refrigerant pipe may be disposed on an outer surface of the housing 110. A flow path may be formed in the refrigerant pipe to allow the refrigerant to flow. For example, the refrigerant pipe may be disposed on a lower surface of the housing 110.

The refrigerant pipe may include a first pipe 140, a second pipe 170, an inlet port 150, and an outlet port 160.

The first pipe 140 may be disposed on a lower surface of the housing 110. The lengthwise direction of the first pipe 140 may be formed in a first direction. The lengthwise direction of the first pipe 140 may be disposed in parallel to the first side surface of the housing 110. The first side surface of the housing 110 may be formed to have a larger cross-sectional area than the second side surface adjacent to the first side surface. The first pipe 140 may be formed in a straight line direction. One end of the first pipe 140 may form the same plane as the second side surface of the housing 110.

A plurality of the first pipes 140 may be provided to be spaced apart from each other. The plurality of first pipes 140 may include a first-first pipe 142 and a first-second pipe 144. The first-first pipe 142 and the first-second pipe 144 may be disposed in parallel to be spaced apart from each other. A first flow path 148 may be formed in the first-first pipe 142 to allow a refrigerant to flow therein. A second flow path 149 may be formed in the first-second pipe 144 to allow a refrigerant to flow therein.

The first pipe 140 may be formed integrally with the housing 110. The first pipe 140 and the housing 110 may be formed by a die casting method. Accordingly, an upper surface of the first pipe 140 may be coupled to a lower surface of the housing 110.

The inlet port 150 may be coupled to one end of the first-first pipe 142. The outlet port 160 may be coupled to one end of the first-second pipe 144. The material of the inlet port 150 and the outlet port 160 may be different from that of the first pipe 140.

An inlet 152 may be formed at one end of the inlet port 150 to introduce a refrigerant. An outlet 162 may be formed at one end of the outlet port 160 so that the refrigerant flowing through the flow path in the refrigerant pipe is discharged. Accordingly, the refrigerant introduced through the inlet 152 may flow through the first pipe 140 and the second pipe 170 and be discharged through the outlet 162.

A third coupling part 154 may be formed at the other end of the inlet port 150 to be coupled to one end of the first-first pipe 142. A cross-sectional shape of the third coupling part 154 may correspond to a cross-sectional shape of a flow path in the first-first pipe 142. Accordingly, the third coupling part 154 may be accommodated inside the first-first pipe 142. At least a portion of the inlet port 150 may be press-fitted into the first-first pipe 142 through the third coupling part 154.

A fourth coupling part 164 may be formed at the other end of the outlet port 160 to be coupled to one end of the first-second pipe 144. The cross-sectional shape of the fourth coupling part 164 may correspond to the cross-sectional shape of the flow path inside the first-second pipe 144. Accordingly, the fourth coupling part 164 may be accommodated inside the first-second pipe 144. At least a portion of the outlet port 160 may be press-fitted into the first-second pipe 144 through the fourth coupling part 164.

The second pipe 170 may be coupled to the first pipe 140 so as to connect the first-first pipe 142 and the first-second pipe 144. Accordingly, the second pipe 170 may be referred to as a connection pipe. A refrigerant flow path may be formed inside the second pipe 170 to allow the refrigerant to flow therein. Accordingly, a refrigerant may be introduced inside of the second pipe 170 through the first-first pipe 142. In addition, the refrigerant may be discharged from the second pipe 170 through the first-second pipe 144.

The cross-sectional area of the second pipe 170 may be smaller than the cross-sectional area of the first pipe 140.

A first coupling part 171 and a second coupling part 172 may be formed at both ends of the second pipe 170 to be coupled inside the first-first pipe 142 and the first-second pipe 144, respectively. The first coupling part 171 may be disposed inside the first-first pipe 142. That is, at least a portion of the second pipe 170 may be press-fitted into the first-first pipe 142 through the first coupling part 171. To this end, the cross-sectional shape of the first coupling part 171 may be formed to correspond to the cross-sectional shape of the flow path inside the first-first pipe 142. The first coupling part 171 may be formed so that a lengthwise direction corresponds to the first direction.

The second coupling part 172 may be disposed in the first-second pipe 144. That is, at least a portion of the second pipe 170 may be press-fitted into the first-second pipe 144 through the second coupling part 172. To this end, the cross-sectional shape of the first coupling part 171 may be formed to correspond to the cross-sectional shape of the flow path inside the first-second pipe 144. The second coupling part 172 may be formed so that a lengthwise direction corresponds to the first direction. The second coupling part 172 may be disposed parallel to the first coupling part 171.

The second pipe 170 may include a connection part 175. The connection part 175 may be formed so that a lengthwise direction corresponds to the second direction. The connection part 175 may have a smaller cross-sectional area than the cross-sectional area of the first pipe 140. The connection part 175 may be disposed perpendicular to the first pipe 140. A region connecting the connection part 175 and the first coupling part 171 or a region connecting the connection part 175 and the second coupling part 172 may be formed to have a curved cross-section.

Meanwhile, a gap G may be formed between the second pipe 170 and a lower surface of the housing 110.

The refrigerant pipe may be disposed to be overlapped with the electronic component disposed in the inner space 112 in up and down directions. For example, as illustrated in FIG. 6, a first electronic component 101, a second electronic component 102, a third electronic component 104, and a fourth electronic component 104 may be disposed to be overlapped with the first-first pipe 142 and a portion of the second pipe 170 in up and down directions. In addition, a fifth electronic component 105, a sixth electronic component 106, and a seventh electronic component 107 may be disposed to be overlapped with the a portion of the first-second pipe 144 and the second pipe 170 in in up and down directions. A printed circuit board 108 may be disposed in the central region inside the inner space 112. The first-first pipe 142 and the first-second pipe 144 may be disposed to face each other with respect to the printed circuit board 108.

According to the above described configuration, since the refrigerant pipe is formed by combining the first pipe and the second pipe after the first pipe is manufactured as one body with the housing, there are advantages in that the manufacturing process becomes simplified and production efficiency becomes enhanced.

In addition, since a separate part such as a sealing member is not required inside the refrigerant pipe, the number of parts is reduced, and accordingly, there is an advantage in that the manufacturing cost is reduced.

Figure 7:
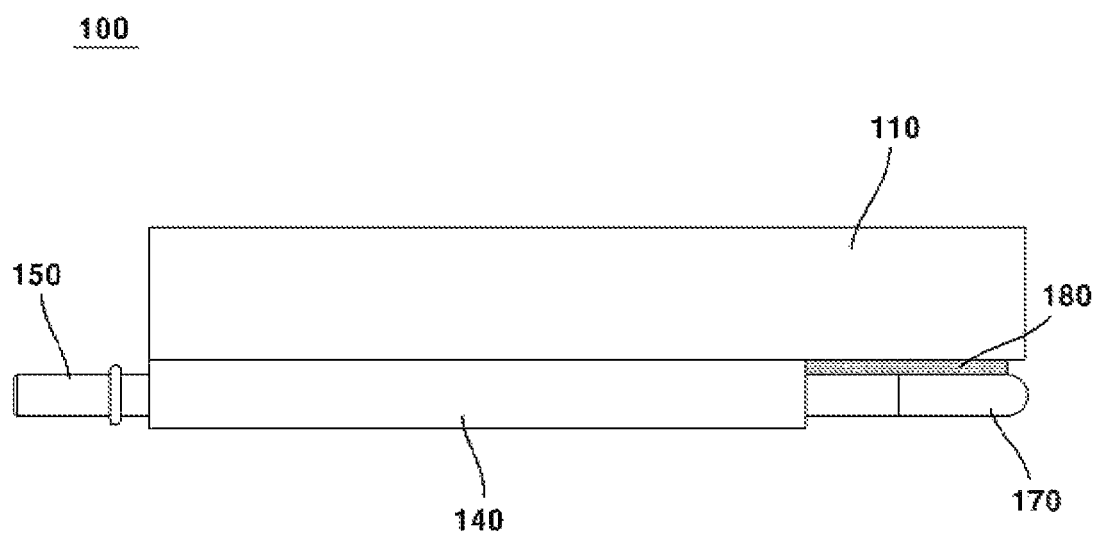
FIG. 7 is a modified embodiment of a converter according to an embodiment of the present invention.

FIG. 7 is a modified embodiment of a converter according to an embodiment of the present invention.

In the present modified embodiment, there is a difference in the arrangement structure between the housing and the second pipe from the above described embodiment.

Referring to FIG. 7, a heat dissipation plate 180 may be interposed between the housing 110 and the second pipe 170. An upper surface of the heat dissipation plate 180 may be in contact with a lower surface of the housing 110, and a lower surface of the heat dissipation plate 180 may be in contact with an upper surface of the second pipe 170. Accordingly, heat generated in the housing 110 may be directly conducted to the second pipe 170 through the heat dissipation plate 180.

In the above, even though all the components constituting the embodiments of the present invention are described as being combined into one or operating in combination, the present invention is not necessarily limited to these embodiments. That is, within the scope of the object of the present invention, all the constituent elements may be selectively combined and operated in one or more. In addition, the terms 'include', 'consist of', or 'have' described above mean that the corresponding component can be present unless otherwise stated, so other components are excluded. Rather, it should be interpreted as being able to further include other components. All terms, including technical or scientific terms, have the same meaning as commonly understood by one of ordinary skill in the art, unless otherwise defined. Terms commonly used, such as terms defined in the dictionary, should be interpreted as being consistent with the meaning of the context of the related technology, and are not interpreted as ideal or excessively formal meanings unless explicitly defined in the present invention.

The above description is merely illustrative of the technical idea of the present invention, and those of ordinary skill in the art to which the present invention pertains will be able to make various modifications and variations without departing from the essential characteristics of the present invention. Accordingly, the embodiments disclosed in the present invention are not intended to limit the technical idea of the present invention, but to explain the technical idea, and the scope of the technical idea of the present invention is not limited by these embodiments. The scope of protection of the present invention should be interpreted by the following claims, and all technical ideas within the scope equivalent thereto should be construed as being included in the scope of the present invention.

The invention claimed is:

1. A converter comprising:
a housing including an inner space;
electronic components disposed in the inner space;
a first pipe disposed on an outer surface of the housing and comprising a first-first pipe and a first-second pipe disposed in parallel to and spaced apart from each other; and
a second pipe coupled at both ends thereof to the first-first pipe and the first-second pipe, respectively,
wherein the first pipe is formed integrally with the housing,
wherein the second pipe is separable from the housing and the first pipe,
wherein the first pipe is connected to the outer surface of the housing, and
wherein a gap is formed between the outer surface of the housing and the second pipe.

2. The converter according to claim 1, wherein a heat dissipation plate is interposed between the outer surface of the housing and an outer surface of the second pipe, and
wherein an upper surface of the heat dissipation plate is in contact with the outer surface of the housing and a lower surface of the heat dissipation plate is in contact with the outer surface of the second pipe.

3. The converter according to claim 1, wherein a lengthwise direction of the first pipe is formed in a first direction that is a straight line direction.

4. The converter according to claim 3, wherein the second pipe includes a connection part formed in a second direction perpendicular to the first direction, and a first coupling part and a second coupling part respectively disposed at both ends of the connection part and formed in the first direction.

5. The converter according to claim 4, wherein the first coupling part is disposed inside the first-first pipe, and
wherein the second coupling part is disposed inside the first-second pipe.

6. The converter according to claim 4, wherein a cross section of a region connecting the connection part and the first coupling part and connecting the connection part and the second coupling part is curved.

7. The converter according to claim 1, wherein an inlet port is coupled to one end of the first-first pipe, and wherein an outlet port is coupled to one end of the first-second pipe.

8. The converter according to claim 7, wherein a material of the inlet port and the outlet port is different from that of the first pipe.

9. The converter according to claim 1, wherein a cross-sectional area of the first pipe is larger than a cross-sectional area of the second pipe.

10. The converter according to claim 1, wherein the housing includes a first side surface and a second side surface adjacent to the first side surface,
wherein a cross-sectional area of the first side surface is greater than a cross-sectional area of the second side surface, and
wherein a longitudinal direction of the first pipe is parallel to the first side surface of the housing.

11. The converter according to claim 10, wherein one end of the first pipe forms an imaginary coplanar surface with the second side surface of the housing.

12. The converter according to claim 1, wherein the electronic components are disposed to overlap the first pipe or the second pipe.

13. The converter according to claim 1, wherein a cross-sectional area of a passage in the first pipe is larger than a cross-sectional area of a passage in the second pipe.

14. A converter comprising:
a housing including an inner space;
an electronic component disposed in the inner space;
a first-first pipe disposed on an outer surface of the housing;
a first-first pipe disposed on the outer surface of the housing and spaced apart from and parallel to the first-first pipe;
a second pipe having both ends coupled to the first-first pipe and the first-second pipe; and
a heat dissipation plate disposed between the housing and the second pipe,
wherein the first pipe is formed integrally with the housing,
wherein the second pipe is separable from the housing and the first pipe,
wherein the first pipe is connected to the outer surface of the housing, and
wherein a gap is formed between the outer surface of the housing and the second pipe.

15. The converter according to claim 14, wherein a lengthwise direction of the first pipe is formed in a first direction that is a straight line direction, and
wherein the second pipe includes a connection part formed in a second direction perpendicular to the first direction, and a first coupling part and a second coupling part respectively disposed at both ends of the connection part and formed in the first direction.

16. The converter according to claim 14, wherein a cross-sectional area of the first pipe is larger than a cross-sectional area of the second pipe.

17. The converter according to claim 15, wherein a cross section of a region connecting the connection part and the first coupling part and connecting the connection part and the second coupling part is curved.

* * * * *